(12) United States Patent
Moore

(10) Patent No.: US 6,662,134 B2
(45) Date of Patent: Dec. 9, 2003

(54) METHOD AND APPARATUS FOR ENABLING EXTESTS TO BE PERFORMED IN AC-COUPLED SYSTEMS

(75) Inventor: Charles E Moore, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 244 days.

(21) Appl. No.: 10/035,654

(22) Filed: Nov. 1, 2001

(65) Prior Publication Data

US 2003/0083841 A1 May 1, 2003

(51) Int. Cl.$^7$ ................................................ G06F 11/26
(52) U.S. Cl. .......................................... 702/117; 714/25
(58) Field of Search .............................. 702/117, 58, 59, 702/64, 65, 120, 124, 126, 189; 714/100, 25, 27, 30, 41, 46, 47, 48; 324/500, 512, 523, 763; 257/41, 48, 734; 438/5, 6, 14, 15, 17, 18

(56) References Cited

U.S. PATENT DOCUMENTS

| | | | | |
|---|---|---|---|---|
| 5,497,378 A | * | 3/1996 | Amini et al. ................ 714/727 |
| 5,726,999 A | * | 3/1998 | Bradford et al. ............ 714/727 |
| 6,000,051 A | * | 12/1999 | Nadeau-Dostie et al. ... 714/727 |
| 6,594,802 B1 | * | 7/2003 | Ricchetti et al. ............... 716/4 |
| 6,601,189 B1 | * | 7/2003 | Edwards et al. .............. 714/30 |

\* cited by examiner

*Primary Examiner*—Marc S. Hoff
*Assistant Examiner*—Edward Raymond

(57) ABSTRACT

A method and apparatus are provided for enabling a Joint Test Access Group (JTAG)-type EXTEST to be performed in an alternating current (AC)-coupled system in order to test one or more AC-coupled connections on a printed circuit board (PCB). Direct current (DC)-restore logic receives an AC-coupled signal that corresponds to an EXTEST test pattern output from a transmitting JTAG-compliant integrated circuit (IC), and converts the AC-coupled signal into a DC signal suitable for use by JTAG logic of a JTAG-compliant receiving IC.

20 Claims, 4 Drawing Sheets

METHOD AND APPARATUS FOR ENABLING EXTESTS TO BE PERFORMED IN AC-COUPLED SYSTEMS

TECHNICAL FIELD OF THE INVENTION

The present invention is generally related to printed circuit boards (PCB) and, more particularly, to a method and apparatus that enable connections between Joint Test Access Group (JTAG)-compliant devices installed on a PCB to be tested with an EXTEST regardless of whether or not the connections being tested are AC-coupled.

BACKGROUND OF THE INVENTION

Traditionally, Bed-Of-Nails tests have been used to test PCB connections. Such tests required that at least one test probe per integrated circuit (IC) chip pin be incorporated into the PCB to provide accessible connection points for testing. Each connection point would be tested for continuity to all other expected connection points on the PCB. This enabled defects in connections to be detected, isolated and repaired.

However, as surface mount technology has improved, the packing density of components on PCBs has improved, and placing Bed-Of-Nails fixtures on PCBs tends to defeat the advantages of packing density improvements. In an effort to enable testing to be performed in a manner that did not thwart packing improvements, a consortium known as The Joint Test Access Group (JTAG) developed a PCB testing methodology that has evolved into the current 1149.1 standard of the Institute of Electrical and Electronics Engineers (IEEE).

Rather than placing Bed-Of-Nails fixtures on the PCB, this standard defines a Boundary Scan Architecture that requires incorporation of standard hardware into integrated circuit (IC) chips to enable IC chips installed on a PCB, and the connections between output pins and expected input pins of the IC chips, to be easily tested with software. This eliminated the need for Bed-Of-Nails fixtures and thus facilitated improvements in surface mount technology and packing density.

IC chips that incorporate the Boundary Scan Architecture are typically referred to as being "JTAG-compliant". A variety of tests can be performed on JTAG-compliant IC chips by sending specific instructions to the standard JTAG hardware incorporated into the IC chips and by evaluating the execution results with software. One of these tests, defined under the JTAG standard as the EXTEST, is used to test connections on the PCB between JTAG-compliant IC chips. During the test, boundary scan cells associated with one or more output pins of a transmitting chip are preloaded with test patterns comprised of 1s and 0s and input boundary cells associated with one or more input pins of a receiving IC chip capture the transmitted test pattern. The captured test patterns are then analyzed to determine whether they match the corresponding transmitted test patterns.

If a mismatch occurs for a particular output pin and input pin, then a defect is assumed to exist in the connection between the pins, and the defect can then be isolated and repaired. The defect may be, for example, a short circuit between paths on the PCB or an open circuit in a path. The EXTEST is used to test all of the channels on the PCB so that any connection defects between components on the PCB can be detected, isolated and repaired.

However, generally, the EXTEST does not work for systems that are AC-coupled because the test is relatively slow in terms of the rate at which the 1s and 0s are transmitted across the PCB. Because of the relatively slow rate at which the 1s and 0s of the test patterns are transmitted, AC coupling in the connection can cause logic levels to decay before they can be checked at the receiving pin. The transmission rate during testing is intentionally kept low so that propagation times across the PCB can be safely ignored.

One prior solution to the AC-coupling problem has been to use complex codes to represent the test patterns. The codes have large AC components and will pass through any AC coupling without decaying before they can be checked at the receiving pin. However, the encoding logic needed to drive the complex test patterns at the output pins and the decoding logic and timing clocks needed to decode them at the receiving pins are generally acknowledged to be too expensive.

Accordingly, a need exists for a method and apparatus that enable the EXTEST to be performed with AC-coupled systems without the need for implementing the aforementioned expensive encoding and decoding logic and timing clocks.

SUMMARY OF THE INVENTION

In accordance with the present invention, a method and apparatus are provided for enabling a Joint Test Access Group (JTAG)-type EXTEST to be performed in an alternating current (AC)-coupled system in order to test one or more AC-coupled connections on a printed circuit board (PCB). Direct current (DC)-restore logic receives an AC-coupled signal that corresponds to an EXTEST test pattern output from a transmitting JTAG-compliant integrated circuit (IC), and converts the AC-coupled signal into a DC signal suitable for use by JTAG logic of a JTAG-compliant receiving IC.

The apparatus comprises direct current (DC)-restore logic that receives an AC-coupled signal corresponding to an EXTEST test pattern output from a transmitting JTAG-compliant integrated circuit IC and converts the AC-coupled signal into a DC signal suitable for use by JTAG logic of a JTAG-compliant receiving IC.

The method of the present invention comprises the steps of providing the DC-restore logic that receives the AC-coupled signal corresponding to an EXTEST test pattern that has been converted into an AC signal by AC-coupling to the connection being tested, and using the DC-restore logic to convert the AC-coupled signal into a DC signal suitable for use by JTAG logic of a JTAG-compliant receiving IC.

These and other features and advantages will become apparent from the following description, drawings and claims.

DETAILED DESCRIPTION OF THE INVENTION

The present invention provides direct current (DC)-restore logic on the receiving end of a connection (also referred to herein as a "line") that enables the EXTEST to be performed with AC-coupled systems in the typical manner in which it is performed in DC systems. The phrases "AC-coupled" and "AC-coupling" are intended herein to denote some type of AC circuit or element that is coupled to a connection, such as, for example, a transformer, a capacitor and resistor, etc.

Figure 1:
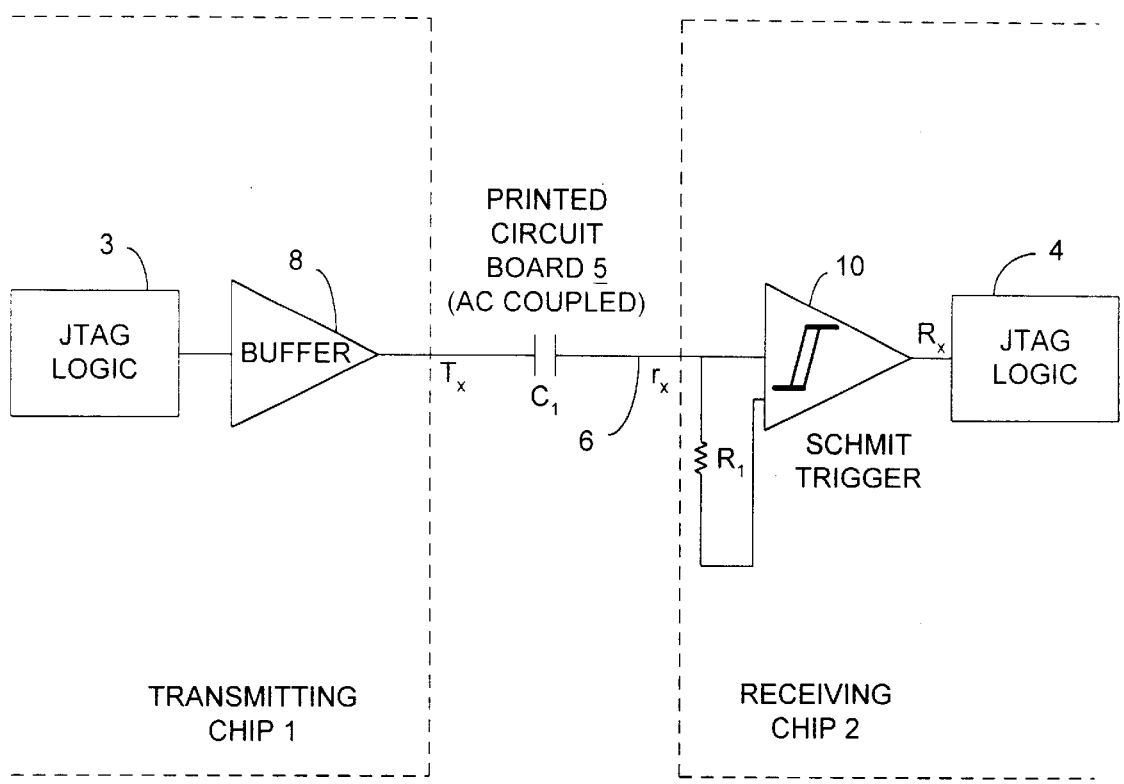
FIG. 1 is a block diagram of a first example embodiment of the present invention illustrating the manner in which a DC-restore circuit can be used to enable the EXTEST to be performed in an AC-coupled system.

FIG. 1 is a block diagram that demonstrates a first example embodiment of the DC-restore logic 10 of the present. The DC-restore logic 10, which in this example embodiment comprises some type of Schmidt Trigger design, is located on the side of the receiving chip 2 between the AC-coupling and the JTAG logic 4. Both the transmitting and receiving chips 1 and 2 have JTAG logic 3 and 4, respectively, associated with their output and input pins. The JTAG logic 3 and buffer 8 integrated in the transmitting chip 1 can be logic of the type typically found in a JTAG-compliant transmitting chip. Likewise, the JTAG logic 4 of the receiving chip 2 can be identical to the JTAG logic normally implemented in the receiving IC chip of JTAG-compliant IC chips. Therefore, the present invention does not require that any change be made to the JTAG logic 3 integrated in the transmitting chip 1. However, as discussed below in more detail, preferably the DC-restore circuit of the present invention, regardless of its particular design, would be integrated into the JTAG logic 4 of the receiving chip. Of course, this would require that a change be made to the JTAG logic 4 of the receiving chip.

The JTAG logic configurations 3 and 4 are represented simply by blocks in FIG. 1 because JTAG logic is standard, known logic that is integrated in JTAG-compliant IC chips, and those skilled in the art will understand the manner in which JTAG logic may be implemented within an IC chip to render the chip JTAG-compliant. It is therefore unnecessary to provide a detailed description of standard JTAG logic and the manner in which it may be implemented to make an IC chip JTAG-compliant. For purposes of the present invention, the JTAG block 3 on the transmitting chip side can be viewed simply as a standard JTAG register in which a test pattern of bits is loaded to cause the bit pattern to propagate across the PCB 5 to the receiving chip pin 2. Similarly, the JTAG block 4 on the receiving chip side can be viewed simply as a standard JTAG register into which a received test pattern of bits is stored and from which the test pattern of bits can be read.

The connection, or line, being tested is represented in FIG. 1 by the line 6. As stated above, for example purposes, the AC-coupling in the connection 6 is represented in FIG. 1 by a capacitor $C_1$ and a resistor $R_1$. The type of AC-coupling that is on the PCB is not relevant to the present invention. As will be understood by those skilled in the art, AC-coupling can take on a variety of forms, such as those previously mentioned.

The manner in which the DC-restore circuit of the present invention enables a standard EXTEST to be performed with an AC-coupled system will now be described with reference to the example embodiment of FIG. 1. During an EXTEST, the buffer 8 on the transmitting chip 1 drives the line 6 with digital 1s and 0s as they are serially output from the JTAG logic 3. These 1s and 0s correspond to the EXTEST test pattern. These digital 1s and 0s correspond to high and low DC values, respectively. Assuming a test pattern of alternating 1s and 0s, a waveform similar to the waveform 21 shown in FIG. 2 would be placed on the line 6 at the output of the buffer 8. This signal is referred to herein as $T_x$. The AC-coupling represented by the capacitor/resistor combination, $C_1/R_1$, converts the waveform 21 shown in FIG. 2 into an AC-coupled waveform, such as the waveform 22 shown in FIG. 2.

Figure 2:
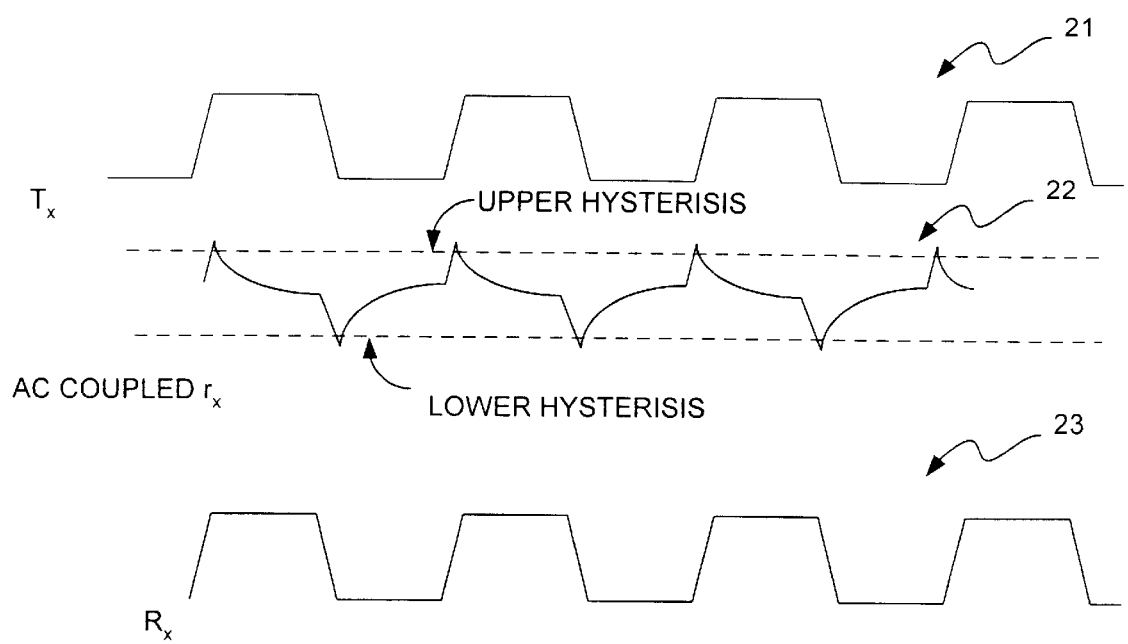
FIG. 2 is a set of waveforms drawn to facilitate the understanding of the example embodiment shown in FIG. 1.

As shown in FIG. 2, the AC-coupled signal 22, which will be referred to herein is $r_x$, has been altered by the AC-coupling. It is important in AC-coupled systems that the transmitting and receiving chips do not necessarily require the same DC levels in order to communicate with one another. For example, the transmitting and receiving chips may have different supply voltages. Thus, although the AC-coupled signal 22 ($r_x$) may be a different waveform than that of the transmitted DC signal $T_x$, the receiving chip must be provided with a signal that it is capable handling.

The AC-coupling in the example of FIG. 1 is represented, for example purposes, by the combination of a capacitor $C_1$ and a resistor $R_1$. The manner in which a Schmidt trigger 10 enables the DC-restore functions to be performed will be described with reference to the block diagram of FIG. 1 and with reference to the waveforms shown in FIG. 2. Generally, in accordance with the present invention, the Schmidt trigger 10 is configured to have a hysteresis range that straddles the DC bias point of the receive side of the AC-coupled line 6. In accordance with this embodiment, an AC-coupled logic level may drive the input to the Schmidt trigger 10 beyond its hysteresis range and change the output state of the Schmidt trigger 10. However, the output of the Schmidt trigger 10 will hold its state after the input to the Schmidt trigger 10 has decayed. The output of the Schmidt trigger 10 can then be read in the normal manner out of the standard JTAG logic 4 test patter register (not shown) located in the receiving IC 2.

The top waveform 21 shown in FIG. 2 corresponds to the DC signal $T_x$ output from the buffer 8 in response to a test pattern of alternating 1s and 0s being output to the buffer 8 from the JTAG logic 3. When the signal $T_x$ encounters the AC-coupling resulting from $C_1/R_1$, the signal $r_x$ is generated, which corresponds to waveform 22 in FIG. 2. The upper and lower hysterisis ranges are denoted by dashed lines on the upper and lower bounds of the waveform 22. The DC output of the Schmidt trigger 10 corresponds to the waveform 23. The AC-coupled signal $r_x$ (waveform 22) will have a transient with an amplitude approximately equal to the amplitude of the transmitted DC signal $T_x$. This transient will occur approximately at the same time that the transmitted DC signal $T_x$ transitions from high to low or from low to high. As stated above, the Schmidt trigger 10 is designed so that its hysteresis range straddles the bias points of the AC-coupled signal. The waveform 23 shown in FIG. 2 corresponds to the non-inverted output of the Schmidt trigger 10. The waveform 23 goes high when the AC-coupled signal $r_x$ exceeds the upper hysterisis range and remains high even as the AC-coupled signal $r_x$ decays. Similarly, the non-inverted output of the Schmidt trigger 10 goes low when the AC-coupled signal $r_x$ goes below the lower hysterisis range. The output of the Schmidt trigger 10 remains low, as indicated by waveform 23 even as the AC-coupled signal $r_x$ begins to rise.

The Schmidt trigger 10 preferably will be integrated with the standard JTAG logic 4 of the receiving chip. Of course, it will be understood by those skilled in the art that the Schmidt trigger 10 could be external to the receiving IC chip, although this might have the disadvantage of decreasing the packing density of the PCB. Locating the DC-restore logic in the JTAG logic 4 of the receiving chip 2 would have the advantage of facilitating improvements in packing density.

In accordance with a second example embodiment, which will now be discussed with reference to FIG. 2, the DC-restore circuit is similar to the type of bus holder logic that is used to maintain the state of a bus when no drivers are transmitting. In ICs, it is typical to have one of many tristatabe buffers driving the bus and one or more receivers receiving the driven signal. Usually, one of the tristable buffers is driving the bus, but there are conditions that can occur in which no buffer is driving the bus. In this event, the bus could be floating, which is generally intolerable, as will be understood by those skilled in the art. To prevent this, bus holder logic is used to maintain the bus at the last driven state by sensing what is on the line and by driving the line in the same direction with a relatively weak signal that can be over come when a buffer begins driving the bus again.

In accordance with the second example embodiment of the present invention, an analogous arrangement is used to hold the side of the connection 36 between the AC-coupling element $C_1/R_1$ and the JTAG logic 34 at a given level to prevent decay of the AC signal from altering the state of the signal intended to be received by the JTAG logic 34 of the receiving chip 32. In accordance with this example embodiment, the DC-restore logic 40 comprises a first inverter 41, which receives the AC-coupled signal $r_x$ and inverts it, a feedback inverter 42 that receives the output of inverter 41 and produces an output that maintains the input of inverter 41 at $r_x$ for a particular period of time, and a third inverter 43 that inverts the output of inverter 41 to generate the DC signal $R_x$, which is the digital signal input to the receiving JTAG logic 34.

Figure 4:
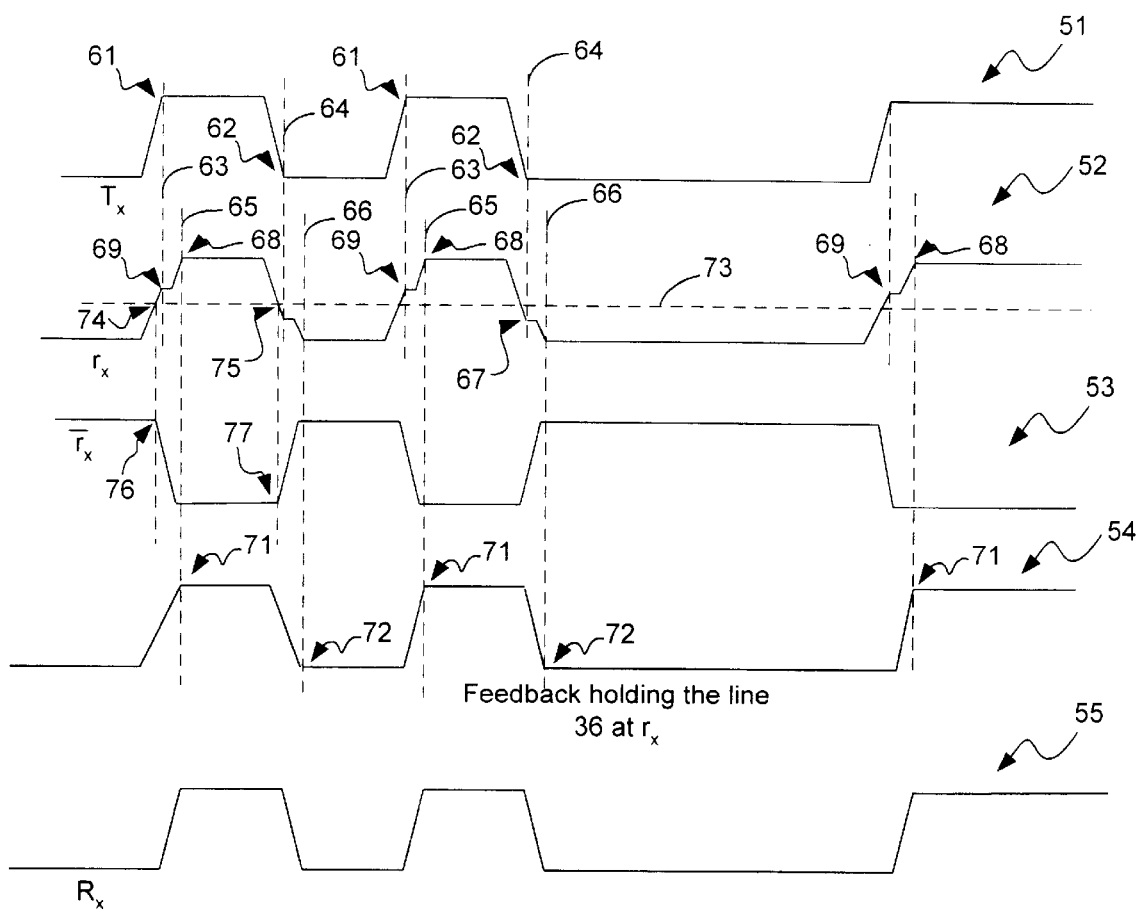
FIG. 4 is a set of waveforms drawn to facilitate the understanding of the example embodiment shown in FIG. 3.

With reference to the waveforms shown in FIG. 4, the waveform 51 corresponds to the signal output from buffer 38, $T_x$. The waveform 52 corresponds to the AC-coupled signal $r_x$ when the DC-restore logic 40 is used. It can be seen from a comparison of the AC-coupled waveform 22 shown in FIG. 2 and the AC-coupled waveform 52 shown in FIG. 4 that the nature of the AC-coupled signal is dependent on the type of DC-restore logic used to obtain $R_x$. The AC-coupled waveforms 22 in FIG. 2 and 52 in FIG. 4 are very different due to the differences in the DC-restore logic 10 and 40, respectively. The waveform 53 corresponds to the output of inverter 41 for the AC-coupled waveform 52 input to the inverter 41. The waveform 54 corresponds to the output of feedback inverter 42, which receives as its input the waveform 53 from inverter 41. The waveform 55 corresponds to the output $R_x$ of inverter 43, which is the output of the DC-restore logic 40.

The inverter 41 has either an implicit or explicit reference that, when sufficiently different from the magnitude of the AC-coupled signal $r_x$, causes the output of the inverter 41 to go high or low, depending on the direction of $r_x$. This threshold value is represented in FIG. 4 by the location at which the dashed line 73 intersects the AC-coupled waveform 52. For example, when the signal $r_x$ (waveform 51) rises above the threshold represented by the intersection of the dashed line 73 and waveform 52 at point 74, the inverter 41 output will begin going low, as indicated by the point 76 on waveform 53. When the output of inverter 41 drops below the threshold of inverter 42, this signal will then be inverted by feedback inverter 42 to a logical high. The input of the inverter 41 will then be maintained at a logical high for a period of time. The output of inverter 42 corresponds to waveform 54.

When the signal $r_x$ (waveform 52) falls below the threshold value represented by the intersection of the dashed line 73 and the waveform 52 at point 75, the output of the inverter 41 will begin rising, as indicated by point 77 on waveform 53. When the output of inverter 41 rises above the threshold of inverter 42, this signal will then be inverted by feedback inverter 42 to a logical low. The input of the inverter 41 will then be maintained at a logical low for a period of time.

The points 61 and 69 on waveforms 51 and 52, respectively, correspond to the same points in time, as indicated by the dashed lines 63. This correspondence is intended to indicate that when the DC waveform $T_x$ rises, the AC-coupled signal $r_x$ rises as well, but only to the level indicated by points 69 on waveform 52. The correspondence in time between points 68 and 71 on waveforms 52 and 54, respectively, as represented by the dashed line 65, is intended to indicate that the output of the inverter 42 pulls the AC-coupled signal $r_x$ up higher to point 68 and holds the AC-coupled signal $r_x$ at this level for a period of time.

The points 62 and 67 on waveforms 51 and 52, respectively, also correspond to the same points in time, as indicated by the dashed lines 64 adjacent the falling edge of the second pulse in the AC-coupled waveform 52. These points are intended to indicate that when $T_x$ falls to a logical low, $r_x$ falls also, but only to point 67. The signal $r_x$ is pulled the rest of the way down by the output of the inverter 42, as indicated by the vertical dashed line 66 and its intersection with waveforms 52 and 54. The AC-coupled signal $r_x$ is then held at this low level for a period of time.

Figure 3:
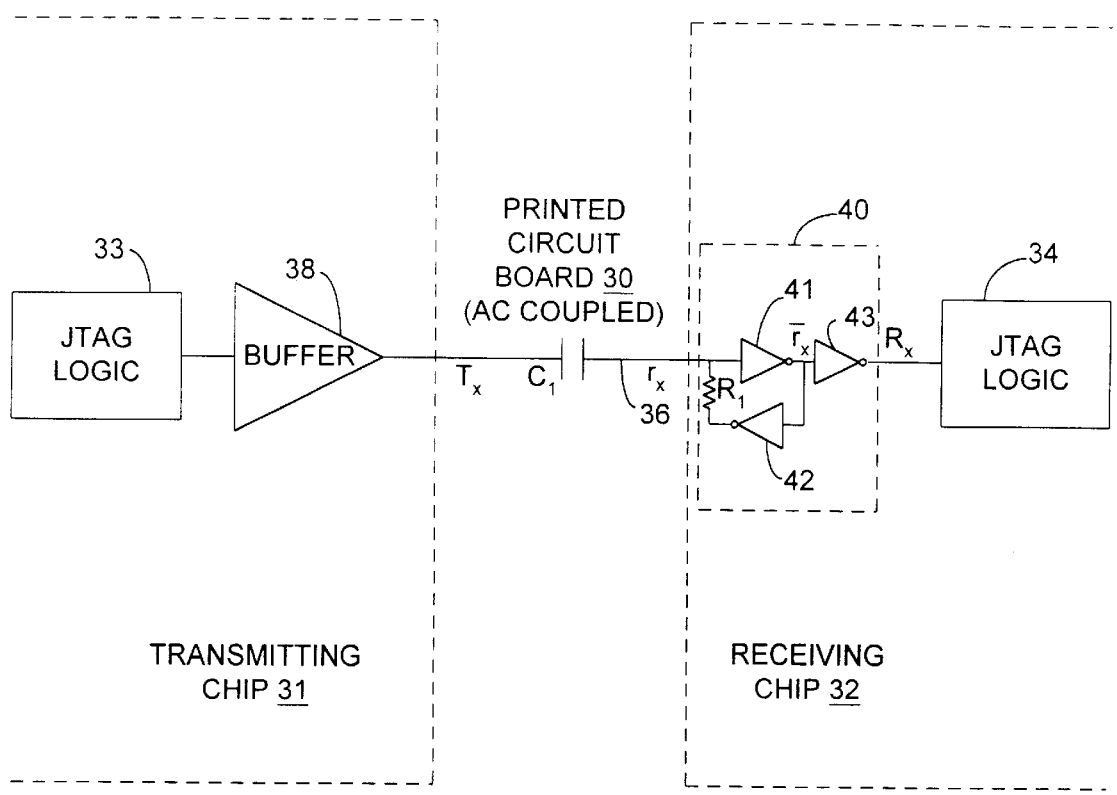
FIG. 3 is a block diagram of a second example embodiment of the present invention illustrating the manner in which a DC-restore circuit can be used to enable the EXTEST to be performed in an AC-coupled system.

Therefore, the DC-restore logic 40 of FIG. 3 causes the AC-coupled signal rx 52 to behave more or less like the DC signal $T_x$ transmitted from the buffer 38 of the transmitting chip 31. This change in the AC-coupled signal being received at the receiving chip 32 enables a properly restored DC signal $R_x$ to be provided to the JTAG logic 34.

Preferably, the inverter 42 comprises tristatable logic so that it has three states, namely, high, low and high output impedance. By providing the inverter 42 with tristatable logic, the DC-restore logic 40 can disabled (high output impedance) when testing is not taking place. The inverter 42 provides a relatively weak feedback signal that is sufficient to hold the input to inverter 41 at a particular state to prevent decaying of the AC-coupled signal from changing the state, but which is also weak enough so that an AC-coupled signal $r_x$ corresponding to a driven DC signal $T_x$ can cause the input to the inverter 41 to be driven to an opposite state.

In accordance with this example embodiment, the DC-restore logic 40 preferably would be integrated with the standard JTAG logic in the IC chip. In other words, what is shown in block 40 would be integrated with what is shown in FIG. 3 as block 34. However, as will be understood by those skilled in the art, the DC-restore logic could be external to the IC chip, but this might have the disadvantage of decreasing the packing density of the PCB. As discussed above, the advantage of implementing the JTAG standard is that it facilitates improvements in packing density, which is also a goal of the present invention.

It should be noted that the DC-restore logic of the present invention is not limited to the example embodiments provided above with reference to FIGS. 1 and 3. These are merely examples of the manner in which the JTAG standard can be easily and relatively inexpensively adapted to work well with AC-coupled systems. Those skilled in the art will understand, in view of the discussion provided herein that there are many ways in which a DC-restore circuit could be designed to prevent the decaying or rising of the AC-coupled signal from resulting in an improper detection of a state change. Therefore, those skilled in the art will understand, in view of the discussion provided herein, that there are many ways in which such a DC-restore circuit could be implemented and that all such implementations are within the scope of the present invention.

What is claimed is:

1. An apparatus for enabling a Joint Test Access Group (JTAG)-type EXTEST to be performed in an alternating current (AC)-coupled system in order to test one or more connections on a printed circuit board (PCB), the apparatus comprising:
   a direct current (DC)-restore logic, the DC-restore logic receiving an AC-coupled signal, the AC-coupled signal corresponding to an EXTEST test pattern output from a transmitting JTAG-compliant integrated circuit (IC), the DC-restore logic converting the AC-coupled signal into a DC signal suitable for use by JTAG logic of a JTAG-compliant receiving IC.

2. The apparatus of claim 1, wherein the the JTAG logic of the JTAG-compliant receiving IC comprises the DC-restore logic.

3. The apparatus of claim 1, wherein the DC-restore logic is located on the PCB external to the JTAG-compliant receiving IC.

4. The apparatus of claim 1, wherein the EXTEST test pattern is being transmitted over a connection from the transmitting JTAG-compliant IC to the receiving JTAG-compliant IC, the AC-coupled signal being produced when a DC EXTEST test pattern output from the transmitting JTAG-compliant integrated circuit IC encounters an AC-coupling element in the connection.

5. The apparatus of claim 4, wherein the DC-restore logic is coupled to the connection between the AC-coupling element and the JTAG logic of the receiving JTAG-compliant IC.

6. The apparatus of claim 1, wherein the DC signal output from the JTAG-compliant transmitting IC corresponds to a series of digital 1s and 0s, the digital 1s and 0s corresponding to the EXTEST test pattern output from the transmitting JTAG-compliant IC, and wherein the DC signal resulting from the conversion of the AC-coupled signal by the DC-restore logic corresponds to the series of digital 1s and 0s output from the transmitting JTAG-compliant IC.

7. The apparatus of claim 1, wherein the DC-restore logic comprises at least a first inverter and a second inverter, the first inverter receiving the AC-coupled signal and inverting the AC-coupled signal when the AC-coupled signal passes a first threshold value of the first inverter to produce a first inverted signal, the first inverter outputting the said first inverted signal, the second inverter receiving said first inverted signal and inverting the first inverted signal to produce an input signal to the first inverter that maintains the first inverter at a first state until the AC-coupled signal changes polarity and passes a second threshold value of the first inverter, wherein when the AC-coupled signal changes polarity and passes the second threshold value of the first inverter, the first inverter outputs a second inverted output signal, the second inverter receiving the second inverted output signal and inverting the received second inverted output signal that is input to the first inverter and that maintains a second state of the first inverter until the AC-coupled signal changes polarity and passes the first threshold value of the first inverter.

8. The apparatus of claim 7, wherein the JTAG logic of the receiving JTAG-compliant IC comprises the DC-restore logic.

9. The apparatus of claim 1, wherein the DC-restore logic comprises a Schmidt trigger, the Schmidt trigger receiving the AC-coupled signal and converting the AC-coupled signal into a DC signal having a first state when the AC-coupled signal exceeds a first hysteresis level of the Schmidt trigger and converting the AC-coupled signal into a DC signal having a second state when the AC-coupled signal exceeds a second hysteresis level of the Schmidt trigger, and wherein the first state is maintained even after the AC-coupled signal has dropped below the first hysteresis level and changes to the second state only when the AC-coupled signal has dropped below the second hysteresis level, and wherein the second state is maintained even after the AC-coupled signal has exceeded above the second hysteresis level and changes to the first state only when the AC-coupled signal has exceeded above the first hysteresis level.

10. The apparatus of claim 9, wherein the JTAG logic of the receiving JTAG-compliant IC comprises the DC-restore logic.

11. A method for enabling a Joint Test Access Group (JTAG)-type EXTEST to be performed in an alternating current (AC)-system in order to test one or more AC-coupled connections on a printed circuit board (PCB), the method comprising the steps of:
   providing direct current (DC)-restore logic, the DC-restore logic receiving an AC-coupled signal, the AC-coupled signal corresponding to an EXTEST test pattern output from a transmitting JTAG-compliant integrated circuit (IC); and
   converting the AC-coupled signal into a DC signal suitable for use by JTAG logic of a JTAG-compliant receiving IC, the AC-coupled signal being converted by the DC-restore logic.

12. The method of claim 11, wherein the JTAG logic of the JTAG-compliant receiving IC comprises the DC-restore logic.

13. The method of claim 11, wherein DC-restore logic is located on the PCB external to the JTAG-compliant receiving IC.

14. The method of claim 11, wherein the EXTEST test pattern is being transmitted over a connection from the transmitting JTAG-compliant IC to the receiving JTAG-compliant IC, the AC-coupled signal being produced when a DC EXTEST test pattern output from the transmitting JTAG-compliant integrated circuit IC encounters an AC-coupling element in the connection.

15. The method of claim 14, wherein the DC-restore logic is coupled to the connection between the AC-coupling element and the JTAG logic of the receiving JTAG-compliant IC.

16. The method of claim 11, wherein the DC signal output from the JTAG-compliant transmitting IC corresponds to a series of digital 1s and 0s, the digital 1s and 0s corresponding to the EXTEST test pattern output from the transmitting JTAG-compliant IC, and wherein the DC signal resulting from the conversion of the AC-coupled signal by the DC-restore logic corresponds to the series of digital 1s and 0s output from the transmitting JTAG-compliant IC.

17. The method of claim 11, wherein the DC-restore logic comprises at least a first inverter and a second inverter, the first inverter receiving the AC-coupled signal and inverting the AC-coupled signal when the AC-coupled signal passes a first threshold value of the first inverter to produce a first inverted signal, the first inverter outputting the said first inverted signal, the second inverter receiving said first inverted signal and inverting the first inverted signal to produce an input signal to the first inverter that maintains the first inverter at a first state until the AC-coupled signal changes polarity and passes a second threshold value of the first inverter, wherein when the AC-coupled signal changes polarity and passes the second threshold value of the first inverter, the first inverter outputs a second inverted output signal, the second inverter receiving the second inverted output signal and inverting the received second inverted output signal that is input to the first inverter and that maintains a second state of the first inverter until the AC-coupled signal changes polarity and passes the first threshold value of the first inverter.

18. The method of claim 17, wherein the JTAG logic of the receiving JTAG-compliant IC comprises the DC-restore logic.

19. The method of claim 11, wherein the DC-restore logic comprises a Schmidt trigger, the Schmidt trigger receiving the AC-coupled signal and converting the AC-coupled signal into a DC signal having a first state when the AC-coupled signal exceeds a first hysteresis level of the Schmidt trigger and converting the AC-coupled signal into a DC signal having a second state when the AC-coupled signal exceeds a second hysteresis level of the Schmidt trigger, and wherein the first state is maintained even after the AC-coupled signal has dropped below the first hysteresis level and changes to the second state only when the AC-coupled signal has dropped below the second hysteresis level, and wherein the second state is maintained even after the AC-coupled signal has exceeded above the second hysteresis level and changes to the first state only when the AC-coupled signal has exceeded above the first hysteresis level.

20. The method of claim 19, wherein the JTAG logic of the receiving JTAG-compliant IC comprises the DC-restore logic.

* * * * *